United States Patent [19]

Kausche et al.

[11] Patent Number: 4,948,750

[45] Date of Patent: Aug. 14, 1990

[54] METHOD AND APPARATUS FOR PRODUCING SEMICONDUCTOR LAYERS COMPOSED OF AMORPHOUS SILICON-GERMANIUM ALLOYS THROUGH GLOW DISCHARGE TECHNIQUE, PARTICULARLY FOR SOLAR CELLS

[75] Inventors: Helmold Kausche, Munich; Rolf Plaettner, Riemerling, both of Fed. Rep. of Germany

[73] Assignee: Siemens Aktiengesellschaft, Berlin and Munich, Fed. Rep. of Germany

[21] Appl. No.: 322,117

[22] Filed: Mar. 13, 1989

[30] Foreign Application Priority Data

Mar. 24, 1988 [DE] Fed. Rep. of Germany ....... 3810021

[51] Int. Cl.$^5$ .................. H01L 21/205; H01L 31/20
[52] U.S. Cl. ..................... 437/101; 427/39; 427/47; 136/258; 118/723
[58] Field of Search ............... 427/39, 47, 74, 255.2; 437/101; 136/258 AM; 118/723

[56] References Cited

U.S. PATENT DOCUMENTS

| | | | |
|---|---|---|---|
| 4,292,343 | 9/1981 | Plaettner et al. | 427/39 |
| 4,481,229 | 11/1984 | Suzuki et al. | 427/38 |
| 4,521,447 | 6/1985 | Ovshinsky et al. | 427/45.1 |
| 4,583,492 | 4/1988 | Cowher et al. | 118/723 |
| 4,686,113 | 8/1987 | Delfino et al. | 427/45.1 |
| 4,760,008 | 7/1988 | Yamazaki et al. | 430/127 |
| 4,808,553 | 2/1989 | Yamazaki | 437/100 |
| 4,859,908 | 8/1989 | Yoshida et al. | 315/111.81 |

FOREIGN PATENT DOCUMENTS

| | | | |
|---|---|---|---|
| 0224360 | 6/1987 | European Pat. Off. | 427/39 |
| 3533146 | 3/1987 | Fed. Rep. of Germany | 357/30 |

OTHER PUBLICATIONS

Easton et al, "The Plasma-Enhanced Deposition of Hydrogenated Amorphous Silicon", *Vacuum*, vol. 34, No. 3-4 (1984), pp. 371 to 376.

Matsuda et al, "Guiding Principle in the Preparation of High-Photosensitive Hydrogenated Amorphous Si-Ge Alloys from Glow-Discharge Plasma", *Japanese Journal of Applied Physics*, vol. 25, No. 1, Jan. (1986), pp. L54-L56.

Yamanka et al, "High-Performance Hydrogenated Amorphous Silicon-Germanium Solar Cells Fabricated by Photochemical Vapor Deposition", *Japanese Journal of Applied Physics*, vol. 26, No. 7, Jul. (1987), pp. 1107-1111.

Nishikawa et al, "Influence of RF Power on Properties of a-$Si_{1-x}Ge_x$:H Prepared by RF Glow Discharge Decomposition", *Japanese Journal of Applied Physics*, vol. 25, No. 4, Apr. (1986), pp. 519-523.

Mackenzie et al, "Structural, Electrical, and Optical Properties of a $Si_{1-x}Ge_x$:H and an Inferred Electronic Band Structure", *Physical Review B*, vol. 31, No. 4, Feb. (1985), pp. 2198-2212.

Szuszczewicz et al, "Spatial Distributions of Plasma Density in a High-Frequency Discharge with a Superimposed Static Magnetic Field", *The Physics of Fluids*, vol. 15, No. 12, Dec. (1972), pp. 2240-2246.

*Primary Examiner*—Aaron Weisstuch
*Attorney, Agent, or Firm*—Hill, Van Santen, Steadman & Simpson

[57] ABSTRACT

A method and apparatus are provided for improving the dangling-bond saturation in amorphous silicon-germanium semiconductor layers. The deposition from the vapor phase of germane, silane, and hydrogen proceeds on the basis of different plasma excitations in the same reactor, that are spatially separated. Capacitive and inductively coupled plasmas are generated at different locations, in such a manner that the two plasmas superimpose in a central substrate region. For increasing the ionization density, the inductively excited plasma has a dc magnetic field for resonance excitation superimposed on it perpendicular to the radio frequency magnetic field. Amorphous silicon-germanium layers containing hydrogen are produced that have a low density of states and are particularly suitable for thin-film tandem solar cells.

28 Claims, 2 Drawing Sheets

METHOD AND APPARATUS FOR PRODUCING SEMICONDUCTOR LAYERS COMPOSED OF AMORPHOUS SILICON-GERMANIUM ALLOYS THROUGH GLOW DISCHARGE TECHNIQUE, PARTICULARLY FOR SOLAR CELLS

BACKGROUND OF THE INVENTION

The present invention is directed to a method for producing semiconductor material layers composed of amorphous silicon-germanium alloys, particularly for use in constructing solar cells. The layers are produced by deposition from a vapor phase, whereby gases containing gaseous hydrogenated or fluorinated silicon and germanium compounds are excited in a gas discharge plasma (low-pressure plasma) in a reactor between electrodes by means of inductive and if necessary capacitive radio-frequency coupling and are deposited as solid, amorphous silicon-germanium layers a-Si$_x$Ge$_{1-x}$ : Y (Y=H, F) on electrodes or substrates attached thereto. The present invention also is directed to an apparatus for the implementation of the method.

U.S. Pat. No. 4,292,343, for example, discloses methods and apparatus for the deposition of pure, amorphous silicon layers (a-Si:H). FIG. 1 of U.S. Pat. No. 4,292,343 describes a capacitative, and FIG. 2 therein describes an inductive rf-glow discharge reactor arrangement. PIN solar cells, based on amorphous silicon, are produced on substrates that are later used as contacts.

The glow discharge technique also provides the possibility of depositing a plurality of PIN cells, that have different energy gaps, on top of one another. Such double or triple tandem cells allows the entire solar spectrum to be more effectively utilized; this provides a greater cell efficiency. To lower the energy gap, germanium can be added to amorphous silicon. The resultant cell thereby becomes more red-sensitive. However, the density of states of the silicon-germanium layers increases greatly, during typical depositions, with an increasing germanium content. The result is that germanium-rich layers, if used for thin-film tandem solar cells (having an energy gap below 1.5 eV), exhibit poor semiconductor properties.

The general belief is that this phenomenon is due to the fact that the ionization and bonding energy of a hydrogen atom in GeH$_4$ is lower at 10.5 eV than that in SiH$_4$ at 11.4 eV. Accordingly, the dangling bonds in an amorphous SiGe:H material are not saturated with hydrogen to the same degree as in an amorphous Si:H material. When silicon and germanium are in juxtaposition in an amorphous structure, then silicon is thereby preferentially saturated by hydrogen atoms. Therefore, it is difficult to uniformly saturate silicon atoms and germanium atoms with hydrogen through a simultaneous deposition of silicon and germanium with the same radio frequency source, dc source, or light source.

One method for attempting to improve the saturation of the dangling-bonds in the silicon-germanium alloys is to dilute the silane-germane mixtures with hydrogen. This, however, fails in germanium rich layers that do not have a sufficient quality to be satisfactorily used in thin-film tandem solar cells.

SUMMARY OF THE INVENTION

The present invention provides a method and an apparatus for producing amorphous silicon-germanium alloy layers that ensures that there is an adequate saturation of the dangling bonds with hydrogen or fluorine. The resultant layer, therefore, can be utilized in thin-film solar cells with increased efficiency.

To this end, the present invention provides a method for producing semiconductor layers which are, for instance, composed of amorphous silicon-germanium alloys, particularly for use in constructing solar cells. The layers are produced by deposition from a vapor phase, whereby gases containing gaseous hydrogenated or fluorinated silicon and germanium compounds are excited in a gas discharge plasma in a reactor between electrodes by means of inductive wave resonance and, if necessary, capacitive radio frequency coupling and are deposited as solid, amorphous silicon-germanium layers on electrodes or substrates attached thereto. Both types of plasma excitation are performed at different locations, but in the same reactor. A dc magnetic field, for resonance excitation, is superimposed on the inductively excited plasma, perpendicular to the radio frequency magnetic field.

In an embodiment of the present invention, hydrogen- and silicon fluoride, and germanium compounds and hydrogen for dilution, are introduced into the reactor either through the wave resonance plasma via a metal end-plate opposite to the substrates or at the edge regions of the substrate holder plate. Referring briefly to FIG. 1, hydrogen is preferably introduced as indicated by arrow 3 and the reactive gases as indicated by arrows 2 and 12.

In an embodiment of the method of the present invention, silane (SiH$_4$) and germane (GeH$_4$) are mixed with hydrogen and used as a reaction gas. In an embodiment, the pressure of the process gases is between approximately $10^{-3}$ to about $10^{-1}$ mBar.

In an embodiment of the method of the present invention, a dc voltage, between 0 and a maximum of 200 volts, and preferably of 60 volts, is applied between the plasma and the substrate holder plate to accelerate or decelerate the ions from the plasma excited by induction.

In an embodiment of the present invention, radio frequency energy at 27 MHz is supplied for the inductively excited radio frequency discharge having a transverse relatively weak homogenous constant magnetic field, and radio frequency energy at 13.5 MHz is supplied for the capacitively excited radio frequency discharge. Preferably, the radio frequency energy is between approximately 10 to about 40 mHz.

An apparatus for performing the method of the present invention is also provided. In an embodiment, the apparatus includes a reactor, constructed primarily from stainless steel and comprising at least one cylinder of silica glass, located in a center of a reactor wall. The cylinder is sealed from the outside by a metal cover. Heatable electrodes are located in the reactor, opposite to one another, and are connected to a radio frequency generator. One of the electrodes is grounded and functions as a substrate holder plate, while the other electrode, located in the center of the reactor, comprises at least one aperture in the region of the silica glass cylinder. Gas inlets and outlets are located in the reactor wall near the edge regions of the electrode having the aperture. The apparatus includes a radio frequency induction coil, that surrounds the gas inlet of the silica glass cylinder. Two isodirectionally polarized magnetic coils are provided that surround the induction coil and, thus, the silica glass cylinder. The apparatus also includes means for regulating the flow rates, the temperature, and the pressure of the reaction gases in the reactor.

In an embodiment of the apparatus of the present invention, a plurality of silica glass cylinders, for the gas inlets, are provided along a side wall of the reactor. The silica glass cylinders are located opposite electrode apertures and every flange is surrounded by an induction coil and by two magnetic coils.

In an embodiment of the apparatus of the present invention the magnetic coils are arranged in a Helmholtz arrangement, whereby the coil spacing is identical to the coil radius. In an embodiment, a constant homogenous magnetic field of between approximately 10 to about 30 Gauss is used to achieve a maximum of the wave resonance for the electron cyclotron wave resonance plasma.

In an embodiment of the apparatus of the present invention, the cross-sectional dimension of the silica quartz vessel is extremely rectangular and therefore, so is the generated plasma beam, in a direction toward the substrate. The substrate is moved perpendicular to the axis of the plasma beam and a continuous, or step by step, deposition along the width of the longest side of the rectangular beam is formed.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

The present invention provides a method for producing amorphous silicon-germanium alloy layers wherein the dangling bonds have an adequate saturation with hydrogen or fluorine. Pursuant to the method, plasma is generated both by inductive radio frequency coupling, and, if desired, additionally by capacitive radio frequency coupling. Both of the plasma excitations are performed in the same reactor, but, are spatially separated. Pursuant to the method, a dc magnetic field is superimposed on the inductively excited plasma perpendicular to the radio frequency magnetic field.

In an embodiment of the present invention, the flow of the reaction gases into the reactor can proceed through two inputs. To this end, the reaction gases can flow through the glass-cylinder used as the plasma source for the inductive coupled wave resonance plasma. In this regard, the gas is fed through the endplate sealed to the glass-cylinder opposite to the substrate holder plate. Alternatively, the reaction gases can flow into the reactor at the edge regions of the substrate holder. Preferably, the hydrogen, for dilution, is fed into the reactor through the glass-cylinder. Preferably, the reactive gases including hydrogenated or fluoridated silicon or germanium are then fed in near the substrates.

The invention utilizes a perception gained in a report by E. P. Szuszczewicz in *The Physics of Fluids*, Vol. 15, No. 12, December, 1972, pages 2240 through 2246 that wave resonance, i.e., Helicon resonance, occurs given a superimposition of an inductively excited plasma with a weak magnetic field. In this specific case, an electron-cyclotron wave resonance is obtained by superimposing a weak, static magnetic field perpendicular to a non-reactive plasma gas generated by inductive radio frequency coupling.

In the subject matter of the present patent application, the radio frequency wave coupled into the plasma, can be divided into a left handed circular wave and a righthanded circular wave by the superimposition of the dc magnetic field. In the resonant case, the lefthanded circular wave is damped in a conductive medium, the plasma, as in the case of a skin effect. The right-handed circular wave is subject to practically no damping in the resonant case; the right-handed circular wave penetrates into the plasma and thereby increases the ionization density.

Figure 1:
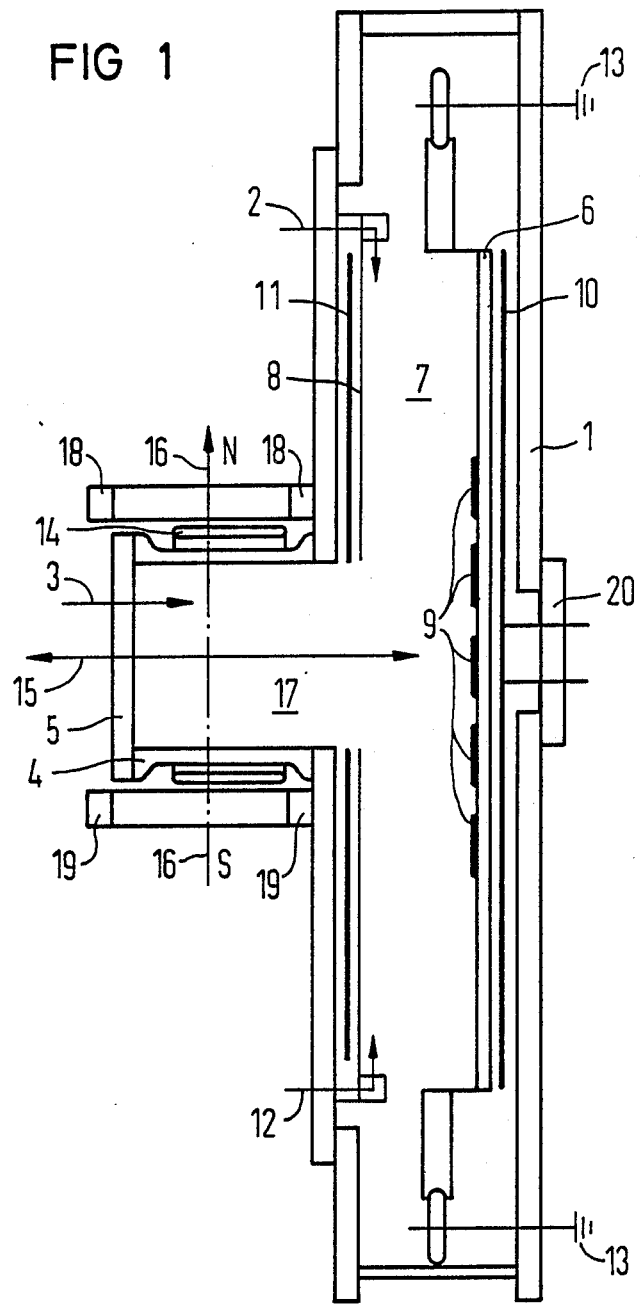
FIG. 1 illustrates an embodiment of the apparatus of the present invention including a reactor arrangement having a capacitive radio frequency excitation and inductive excitation with superimposed, perpendicular dc magnetic field (wave or helicon resonance).

Referring now to FIG. 1, an apparatus of the present invention is illustrated. As illustrated, the gaseous compounds for producing the amorphous, hydrogenated silicon-germanium layers are introduced at the locations references by arrows 2, 3, and 12. The germane is, for instance, introduced at the locations referenced with arrows 2 and 12; and hydrogen or the the mixture of silane with hydrogen is introduced at the location referenced by arrow 3. The gases are introduced into a stainless steel reactor 1 that has been previously evacuated to a residual gas partial pressure of about $10^{-6}$ mbar.

As illustrated, the reactor includes a substrate holder plate 6 and a silica glass cylinder 4. The substrate holder plate 6 functions to hold the substrates 9. The cylinder 4 is closed at an end thereof by a metal cover 5. The metal cover 5 includes, an inlet 3, for allowing silane or hydrogen to flow into the reactor, and functions to simultaneously apply a dc voltage of, for example, 50 volts between the plasma and the substrate holder plate 6 for accelerating or decelerating the ions from the highly excited plasma.

By supplying radio frequency energy (13.5MHz), the glow discharge 7 of the process gas (the flow of which is indicated by arrows 2, 12) between an electrode 8 and the substrates 9, with the substrate holder 6 serving as a second electrode, is initiated. Both electrodes 6, 8 are heated to approximately 100° C. to about 300° C. by electrode heaters 10 and 11. The electrode 6 is grounded at the locations referenced by the numeral 13. A gas outlet 20 to a vacuum pump is also provided.

A plasma excitation 17 proceeds, if desired, simultaneously with the plasma excitation 7. To this end, the electrode 8 includes a clearance, or opening, located in its center, through which the silica glass cylinder 4 is attached to the reactor 1. In the preferred embodiment illustrated, the hydrogen flows into the reactor 1 as indicated by arrow 3. An induction coil 14 is provided around the cylinder 4. Proceeding from the induction coil 14, both hydrogen and the other back diffused reaction gases are ionized by an inductively excited plasma 17 (radio frequency energy of 27 MHz).

The two plasmas 7, 17 can partly superimpose and can influence one another. To achieve the electron cyclotron wave resonance, and thereby increase the ionization density, a dc magnetic field 16 (indicated by arrow N S) is superimposed on the inductively excited plasma 17 perpendicular to the radio frequency magnetic field (indicated by the arrow 15).

With a proper selection of the dc magnetic field, i.e., given a favorable coil current in the two coils 18 and 19, that are attached at the outside and are isodirectionally polarized, the wave resonance, i.e., the Helicon resonance described above, occurs. The magnetic coils 18, 19 are thereby arranged and operated in what is referred to as a Helmholtz arrangement, whereby the coil spacing is equal to the coil radius or nearly equal thereto.

Due to the feed of energy through the capacitively excited radio frequency discharge 7, the inductively coupled radio frequency discharge 17 near the wave resonance for the excitation of hydrogen and silane and/or germane that is diffused in, and the acceleration voltage that are selectable largely independently of one another, favorable deposition conditions for an amorphous a-SiGe:H material having low state density of states can be determined. These can be determined in combination with the gas pressure and flow for the silane, germane, and hydrogen. For example, given a pressure of approximately $10^{-2}$ mbar, the overall flow is set to approximately 50-100 sccm.

Figure 2:
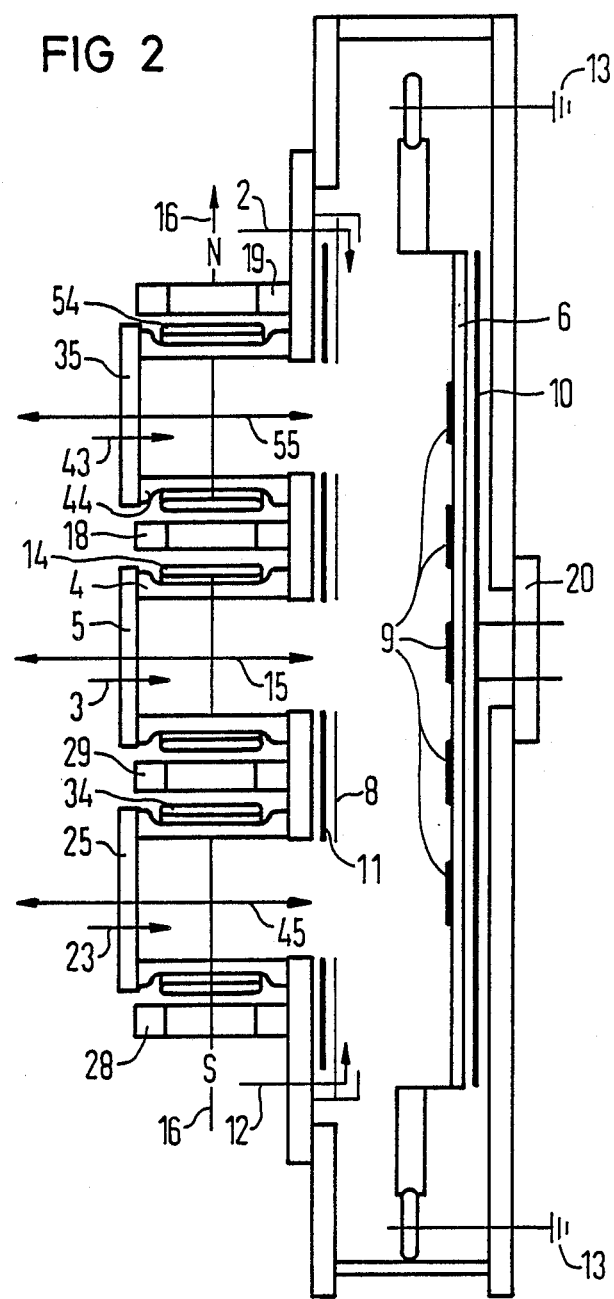
FIG. 2 illustrates an embodiment of the apparatus of the present invention wherein large substrate areas can be coated by multiplying the inductive in-coupling.

Referring now to FIG. 2, another embodiment of the apparatus of the present invention is illustrated. A uniform deposition on large substrate surfaces can be achieved with the reactor arrangement illustrated. In FIG. 2, essentially the same reference characters apply as in FIG. 1.

However, the illustrated reactor includes three silica glass cylinders 4, 24, and 44. Each silica glass cylinder 4, 24, and 44, includes a cover 5, 25, and 35, respectively. Silane and/or hydrogen is fed into the reactor through the silica glass cylinders 4, 24, and 44 along feed paths 3, 23, and 43, respectively. As in the embodiment of the apparatus illustrated in FIG. 1, germane or germane/silane mixture is fed into the reactor along paths indicated by arrows 2 and 12.

Likewise, three induction coils 14, 34, and 54 are provided. The direction of the radio frequency magnetic fields in the reactor is referenced by arrows 15, 45, and 55. The corresponding magnetic coils are referenced by 18, 19, 28, and 29. The deposition of the layers on the substrates 9 proceeds as discussed above for the embodiment illustrated in FIG. 1.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for producing material layers by deposition from the vapor phase, wherein process gases are excited in a gas discharge plasma in a reactor by means of inductive radio frequency coupling and a superimposed constant magnetic field perpendicular to an rf magnetic field produced by said inductive radio frequency coupling, to produce an electron cyclotron wave resonance plasma for performing an electron cyclotron wave resonance plasma enhanced CVD-process.

2. The method of claim 1 used to deposit semiconductor layers.

3. The method of claim 1 wherein a frequency of between approximately 10 to about 40 MHz is used 4. The method of claim 1 wherein a frequency of 27 MHz is used.

5. The method of claim 1 wherein a constant homogeneous magnetic field of between approximately 10 to about 30 Gauss is used to achieve a maximum of the wave resonance for the electron cyclotron wave resonance plasma.

6. The method of claim 1 including the step of providing a substrate holder plate located at a distance to the plasma of between 0 to about 20 cm.

7. The method of claim 1 wherein the pressure of a process gas in the gas discharge is between approximately $10^{-3}$ to about $10^{-1}$ mBar.

8. The method of claim 1 wherein the pressure of the process gases is approximately $3 \times 10^{-2}$ mBar.

9. The method of claim 1 wherein the process gases contain silane ($SiH_4$) and hydrogen.

10. The method of claim 1 wherein the process gases contain germane ($GeH_4$) and hydrogen.

11. The method of claim 1 wherein the process gases contain $SiH_4$, $GeH_4$, and hydrogen.

12. The method of claim 1 wherein the process gases are diluted by hydrogen at a ratio of between approximately 1:5 ($H_2$) to about 1:50 ($H_2$).

13. The method of claim 1 including the step of providing a hydrogen inlet located in a metal plate near the plasma opposite to a substrate holder, thereby allowing the flow of hydrogen to be directed from the plasma towards the substrate holder plate.

14. The method of claim 1 wherein reactive process gases are fed in near a substrate holder plate.

15. The method of claim 1 wherein a DC-voltage between 0 to about 200 volts is superimposed on the electron cyclotron wave resonance plasma measured between a substrate holder plate and an opposite metal plate near the plasma for acceleration or deceleration of generated ions from the electron cyclotron wave resonance plasma in a direction toward a substrate.

16. The method of claim 15 wherein the DC voltage is 60 volts.

17. The method of claim 1 comprising the steps of producing a radio frequency diode plasma in the vicinity of a substrate by a capacitive rf coupling with a frequency of 13.5 MHz for an additional ionizing of process gas outside of the region of electron cyclotron wave resonance plasma.

18. An apparatus for the deposition of material layers composed of amorphous silicon-germanium alloys on substrates comprising:

a reactor comprising at least one cylinder of silica glass located in a center of a side wall of the reactor, the cylinder being sealed by a metal cover-plate;

heatable electrodes located in the reactor, opposite to one another, that are connected to a radio frequency generator, a first electrode being grounded and functioning as a substrate holder plate, a second electrode in the center of the reactor having at least one aperture in a region near the silica glass cylinder;

gas inlets in the walls of the reactor at at least one edge region of the first electrode and in the metal cover plate at the silica glass cylinder;

a radio frequency induction coil surrounding the silica cylinder;

two isodirectionally polarized magnetic coils that surround the induction coil and the silica glass cylinder for producing a unidirectional DC magnetic field perpendicular to an RF magnetic field produced by said radio frequency induction coil; and means for regulating the flow rates and the pressure of reaction gases in the reactor.

19. The apparatus of claim 18 including a plurality of silica glass cylinders, having gas inlets, located in the side wall of the reactor.

20. The apparatus of claim 19 wherein each cylinder is surrounded by an induction coil and by two magnetic coils.

21. The apparatus of claim 20 wherein the magnetic coils are arranged in a Helmholtz arrangement, the coil spacing being identical to the coil radius.

22. The apparatus of claim 18 wherein the magnetic coils are arranged in a Helmholtz arrangement, wherein the coil spacing is substantially identical to the coil radius.

23. The apparatus of claim 18 wherein the reactor is constructed primarily from stainless steel.

24. The apparatus of claim 18 wherein the reactor has a rectangular cross-sectional long dimension and means for moving substrates perpendicular to a plasma beam.

25. A method for producing semiconductor layers composed of amorphous silicon-germanium alloys a-$Si_x Ge_{1-x}$:Y, wherein Y is H, F; and $0<x<1$, by deposition from vapor phase, whereby gases containing hydrogenated or fluorinated silicon and germanium compounds are excited in a gas discharge plasma in a reactor and are deposited as solid, amorphous silicon-germanium layers on substrates, comprising the steps of:

locating the substrates in a reactor on a grounded substrate holder that functions as an electrode;

introducing hydrogen or other process gases for inductive plasma excitation into said reactor via an aperture formed in a central region of a metal cover plate of a silica glass cylinder that is attached to said reactor;

introducing at least one of a hydrogenated silicon-germanium compound as a reaction gas into the reactor at edge regions of the substrate holder plate;

producing plasma both by capacitive radio frequency coupling and inductive radio frequency coupling;

executing both plasma excitations in the same reaction, but, spatially separated; and superimposing a dc magnetic field for resonance excitation on the inductively excited plasma perpendicular to a radio frequency magnetic field.

26. The method of claim 25 including the step of using as a reaction gas silane ($SiH_4$) and germane ($GeH_4$) mixed with hydrogen.

27. The method of claim 25 including the step of using as a reaction gas fluorinated and hydrogenated silicon and germanium compounds mixed with hydrogen.

28. The method of claim 25 wherein a dc voltage of a maximum of 200 volts is applied between the plasma and the substrate holder for acceleration or deceleration of the ions from the plasma excited by induction and wave resonance.

* * * * *